(12) United States Patent
Van Rens

(10) Patent No.: US 7,026,845 B2
(45) Date of Patent: Apr. 11, 2006

(54) ELECTRONIC CIRCUIT FOR CONVERTING A CURRENT SIGNAL TO A VOLTAGE SIGNAL

(75) Inventor: Frank Johan Peter Van Rens, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 8 days.

(21) Appl. No.: 10/502,154

(22) PCT Filed: Dec. 20, 2002

(86) PCT No.: PCT/IB02/05672

§ 371 (c)(1),
(2), (4) Date: Jul. 20, 2004

(87) PCT Pub. No.: WO03/063051

PCT Pub. Date: Jul. 31, 2003

(65) Prior Publication Data

US 2005/0062506 A1   Mar. 24, 2005

(30) Foreign Application Priority Data

Jan. 24, 2002   (EP)   ................................ 02075303

(51) Int. Cl.
    *H02M 11/00*   (2006.01)
(52) U.S. Cl. ...................................... 327/103
(58) Field of Classification Search ................ 327/103, 327/355, 359; 363/73, 77
    See application file for complete search history.

(56) References Cited

U.S. PATENT DOCUMENTS

| 4,017,750 | A  |   | 4/1977  | Voorman |
| 4,268,759 | A  |   | 5/1981  | Gilbert |
| 4,866,312 | A  | * | 9/1989  | Kearney et al. ............ 327/103 |
| 5,367,248 | A  | * | 11/1994 | Lin ............................ 323/312 |
| 5,604,501 | A  |   | 2/1997  | McPartland |
| 6,225,802 | B1 |   | 5/2001  | Ramalho et al. |
| 6,278,393 | B1 |   | 8/2001  | Lopata et al. |
| 6,324,083 | B1 |   | 11/2001 | Thus et al. |
| 6,333,238 | B1 |   | 12/2001 | Baldwin et al. |

* cited by examiner

Primary Examiner—My-Trang Nu Ton

(57) ABSTRACT

The invention relates to a method and to an electronic circuit for converting a current signal Isignal to a voltage signal Vout) comprising:
a first resistor Rgain and a second resistor Rconversion,
means 2 for generating a first current Igain based on a reference voltage Vreference applied over the first resistor,
means 3, 4 for generating a second current, the magnitude of the second current being determined on the basis of the multiplied magnitude of the first current and the current signal,
means 5 for applying the second current to the second resistor for generating the voltage signal.

16 Claims, 5 Drawing Sheets

ELECTRONIC CIRCUIT FOR CONVERTING A CURRENT SIGNAL TO A VOLTAGE SIGNAL

FIELD OF THE INVENTION

The present invention relates to the field of converting a current signal to a voltage signal, and more particularly to the usage of an integrated resistor for the purposes of the current-voltage conversion.

BACKGROUND AND PRIOR ART

A variety of manufacturing methods for integrated resistors is known from the prior art. It is convenient to make these resistors in the same process steps as the rest of the integrated circuit. Therefore, the exact way in which the resistors are made depends on which process is used to produce the integrated circuit.

Integrated circuits are generally fabricated with polysilicon resistors that are formed on the semiconductor substrate. Such resistors generally have a resistor body, formed of doped polysilicon and having metallic leads coupled to opposing ends of the resistor body, generally though contacts in field oxide. The contacts are connected to metal interconnect. The resistor body can be formed concurrently with polysilicon transistor gate electrodes, such resistor body generally doped and resting on the field oxide.

Integrated circuits that require passive resistors often have tight tolerances on the resistance value of these resistors. However, these prior art semiconductor resistors are subjected to variations in resistance value. Sources of variation in the resistance value of theses resistors include process fluctuations that result in physical changes to the resistor properties such as physical dimension or resistivity and changes in temperature. The sources of change in temperature can be either external to the resistor itself or internal due to the self-heating effects associated with power dissipation. As the resistor temperature changes, the value of resistance of the resistor also changes.

The general prior art method utilized for minimizing the resistance alteration effects due to the temperature coefficient of resistance (TCR) of semiconducting resistor (a resistor formed of semiconductor material) is to increase the doping concentration in the resistor body to a sufficiently high level such that the TCR of the resistor body is at a minimum. Then the resistors are built with dimensions that make the resistor head resistance a small percentage of the resistor body resistance. As a result, the resistor heads TCR has little effect on the overall resistor temperature characteristics.

A corresponding integrated circuit with an integrated resistance having a minimized temperature coefficient is shown in U.S. Pat. No. 6,333,238. Another method for producing a semiconductor integrated circuit with an integrated resistor is known from U.S. Pat. No. 6,329,262.

Further it is known to use integrated resistors for digital to analogue converters. U.S. Pat. No. 5,604,501 shows a digital-to-analog converter including a resistor string having intermediate taps at resistor junctions as well as resistor-potential junctions. Switching transistors are coupled between a respective intermediate tap and an output node. Decode circuits are capable of switching at least two transistors to be in the on state at the same time to electrically couple more than one intermediate tap to the output node to produce at least one analog output. One row select line can be energized simultaneously with at least two column select lines. Alternatively, at least two row select lines can be energized simultaneously with one column select line.

U.S. Pat. No. 6,278,393 shows an integrated circuit including a digital-to-analog converter in which a resistor string is adapted to be coupled to a reference source. The resistor string includes a plurality of serially coupled impedances defining intermediate taps at the junctions thereof. A first plurality of switches are coupled between a first output node and respective ones of the intermediate taps.

A first selection circuit receives a first digitally codes signal and is coupled to each switch in the first plurality of switches. The first selection circuit selectively switches the first plurality of switches to predetermined states depending upon a first digitally coded signal provided thereto, to generate a first analog output. A second plurality of switches are coupled between a second output node and respective ones of the intermediate taps. A second selection circuit coupled to each switch in the second plurality of switches selectively switches the second plurality of switches to predetermined states depending upon a second digitally codes signal provided thereto, to generate a second analog output.

Generally the resistance tolerance of an integrated resistor is within about ±20%. Integrated resistors having a high square resistance have even higher tolerances. The lack of a method to produce integrated resistors having a precise resistance value has limited the field of use of integrated resistors in the prior art.

SUMMARY OF THE INVENTION

It is an object of the present invention to provide an improved electronic circuit for converting a current signal to a voltage signal by means of a resistor with a high degree of precision and which is suitable for monolithic integration.

The present invention provides an electronic circuit for converting a current signal to a voltage signal comprising:
a first resistor and a second resistor,
means for generating a first current based on a reference voltage applied over the first resistor,
means for generating a second current, the magnitude of the second current being determined on the basis of the multiplied magnitudes of the first current and the current signal,
means for applying the second current to the second resistor for generating the voltage signal.

Further embodiments of the electronic circuit of the invention are given in the dependent claims.

Further the invention provides for a method for converting a current signal to a voltage signal comprising the steps of:
generating a first current by means of applying a reference voltage to a first resistor,
generating a second current, the magnitude of the second current being determined on the basis of the multiplied magnitudes of the first current and the current signal,
applying the second current to the second resistor for generating the voltage signal.

Further embodiments of the method of the invention are given in the dependent claims.

The invention is particularly advantageous as it allows to convert a current signal to a voltage signal by means of first and second resistors whereby the conversion is performed with a high degree of precision. To obtain a high degree of precision it is not necessary to provide precision resistors having exact resistance values.

Rather the precision of the conversion in accordance with the present invention is determined by the precision of the ratio of the resistance values of the first and second resistors. This makes the electronic circuit of the present invention particularly suitable for monolithic integration as it is possible to produce a pair of integrated resistors having a precise resistance ration without difficulty.

One field of application of the present invention is for CMOS integrated circuits, such as processors with analogue current outputs. Typically such an analogue current output needs to be converted to a voltage for example for the purposes of amplification. The problem of providing a precise and cost efficient interface between the processor and the following amplification stage is solved by means of the present invention.

DETAILED DESCRIPTION

Figure 1:
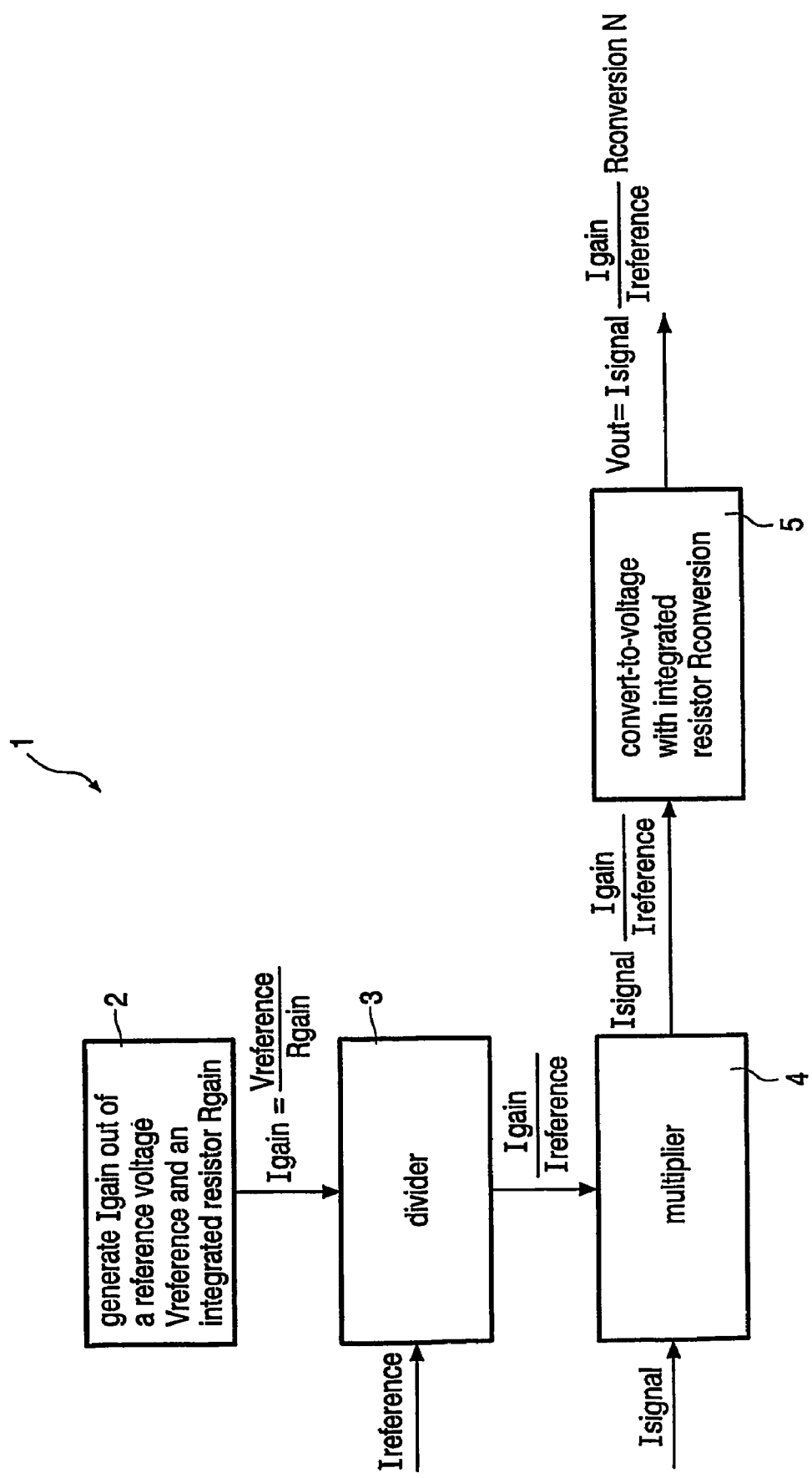
FIG. 1 shows a block diagram of a first embodiment of an electronic circuit in accordance with the invention.

FIG. 1 shows a block diagram of an electronic circuit 1 for converting a current signal Isignal to a voltage signal Vout. The electronic circuit 1 has two integrated resistors Rgain and Rconversion. A reference voltage Vreference is provided to the electronic circuit 1 or generated within the electronic circuit 1. By means of the reference voltage Vreference and the integrated resistor Rgain a current Igain is generated in block 2 of the electronic circuit 1. The current Igain equals Vreference divided by Rgain.

The current Igain is provided to a divider 3. Further a reference current Ireference is provided to the divider 3. The purpose of the provider 3 is to divide the current Igain by the reference current Ireference. The resulting current Igain/Ireference is provided to multiplier 4. Further the current signal Isignal to be converted is applied to multiplier 4. The multiplier 4 provides an output current having a magnitude which is determined on the basis of the magnitudes of the current signal Isignal and the current Igain divided by the reference current Ireference. In the example considered here the output current provided by the multiplier 4 is the product of Isignal and Igain divided by Ireference.

The output current of the multiplier 4 is provided to block 5 of the electronic circuit 1 which contains the integrated resistor Rconversion. The block 5 serves to convert the output current of the multiplier 4 to the voltage signal Vout. This is done by applying at least a portion of the output current of the multiplier 4 to the integrated resistor Rconversion. As a consequence the voltage signal Vout is as follows:

$$Vout = \frac{Isignal}{Ireference} Vreference \frac{Rconversion}{Rgain} N$$

Where N is a constant and depends on the configuration of the implementation. Convenient choices for N are N=½ or N=1.

As it appears from the above formula the value of the voltage signal Vout does not depend on the absolute values of Rgain and Rconversion but on the ratio of Rconversion and Rgain. Hence, even though the absolute values of the resistances of Rgain and Rconversion may have large tolerances, the ratio of the resistances of Rgain and Rconversion can be manufactured with a high degree of precision such that the current to voltage conversion of the present invention is also accomplished with a high degree of precision even though integrated resistors are utilized.

Figure 2:
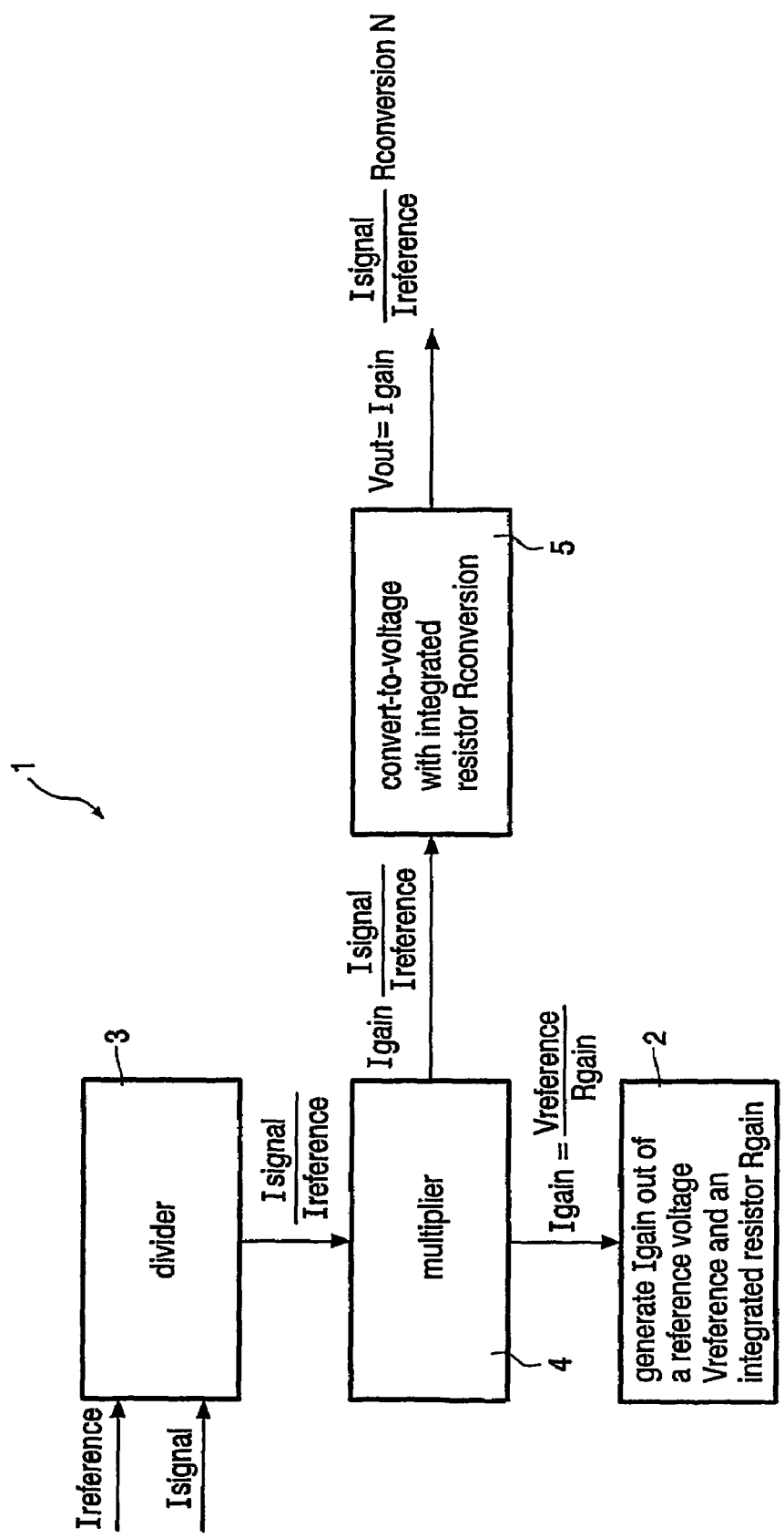
FIG. 2 shows a block diagram of a second embodiment of an electronic circuit in accordance with the present invention.

FIG. 2 shows an alternative embodiment of the electronic circuit 1 where like elements are denoted by the same reference numerals as in the embodiment of FIG. 1.

In the embodiment of FIG. 2 a current signal Isignal is applied to the divider 3 as well as the reference current Ireference. The output provided by the divider 3 is Isignal/Ireference. This value is inputted into the multiplier 4.

Further the multiplier 4 receives the current Igain from the block 2. This current Igain is multiplied by Isignal/Ireference in the multiplier 4. The mutliplier 4 outputs the product of Igain and Isignal divided by Ireference.

The output of the multiplier 4 is provided to the block 5 for current to voltage conversion in the same way as in the embodiment of FIG. 1.

Figure 3:
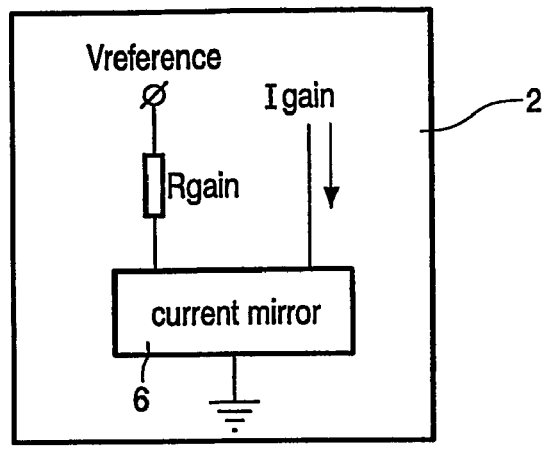
FIG. 3 shows a block diagram for the generation of the circuit Igain in the embodiments of FIGS. 1 and 2.

FIG. 3 shows a detailed embodiment of the block 2 of the embodiments of FIGS. 1 and 2. The reference voltage Vreference is either externally applied to the electronic circuit 1 or generated within electronic circuit 1. The reference voltage Vreference is applied over the integrated resistor Rgain. One of the terminals of the resistor Rgain is connected to current mirror 6 which is connected to ground. This way the current Igain is obtained.

Figure 4:
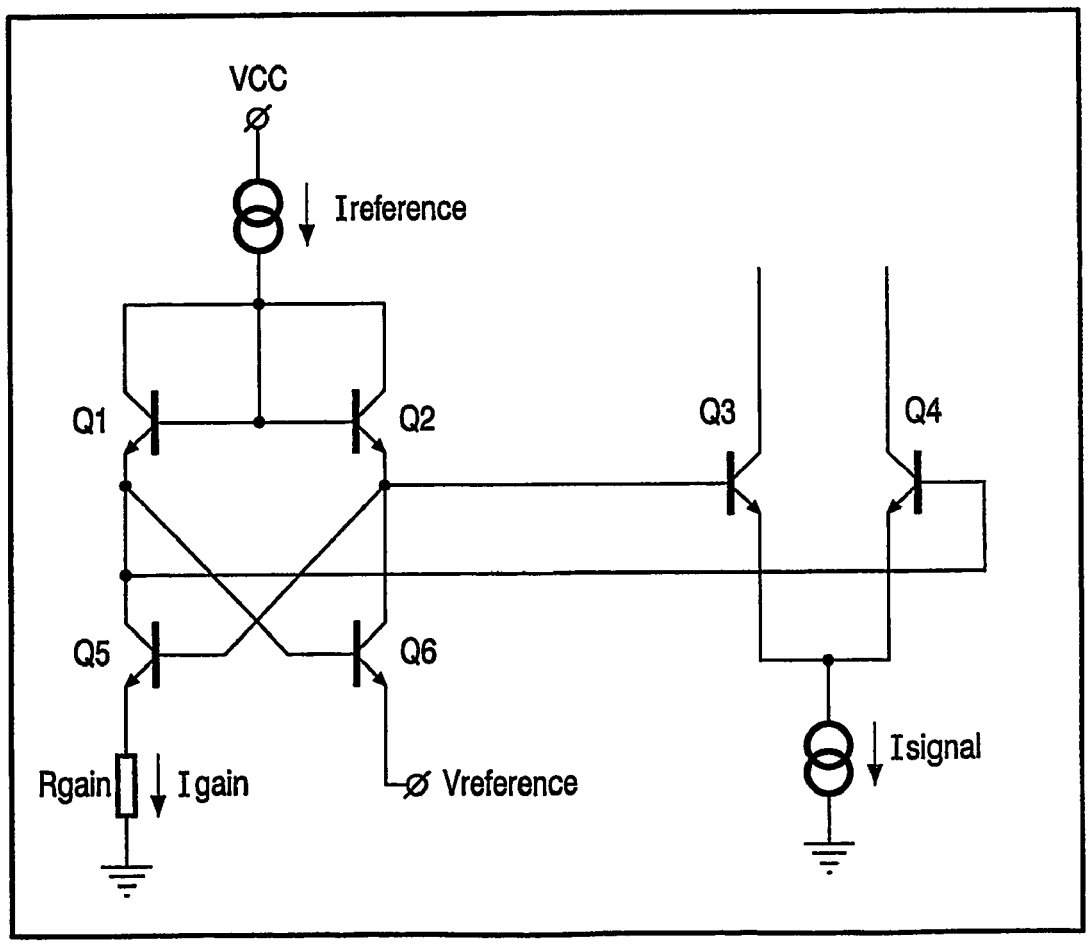
FIG. 4 shows a detailed embodiment of the electronic circuit of FIG. 1.

FIG. 4 shows a more detailed embodiment of the electronic circuit of FIG. 1. The current signal Isignal is split by means of the differential pair of bipolar transistors Q3 and Q4. A differential base-emitter voltage is provided to the differential pair of bipolar transistors Q3 and Q4 from the circuit arrangement comprising transistors Q1, Q2, Q5 and Q6.

The bases of the transistors Q1 and Q2 are coupled to a common potential which is also common to the collectors of Q1 and Q2. The reference current Ireference is applied to this common potential. The emitter of the transistor Q1 is coupled to the collector of the transistor Q5. The emitter of the transistor Q5 is coupled to Rgain.

The emitter of the transistor Q2 is coupled to the collector of the transistor Q6. The emitter of the transistor Q6 is coupled to a further reference voltage Vreference.

The base of the transistor Q6 is coupled to the emitter of the transistor Q1; the base of the transistor Q5 is coupled to the emitter of the transistor Q2. The differential base-emitter voltage for the differential pair of bipolar transistors Q3 and Q4 is provided between the potential of the emitter of transistor Q2 and the emitter of transistor Q1.

Figure 5:
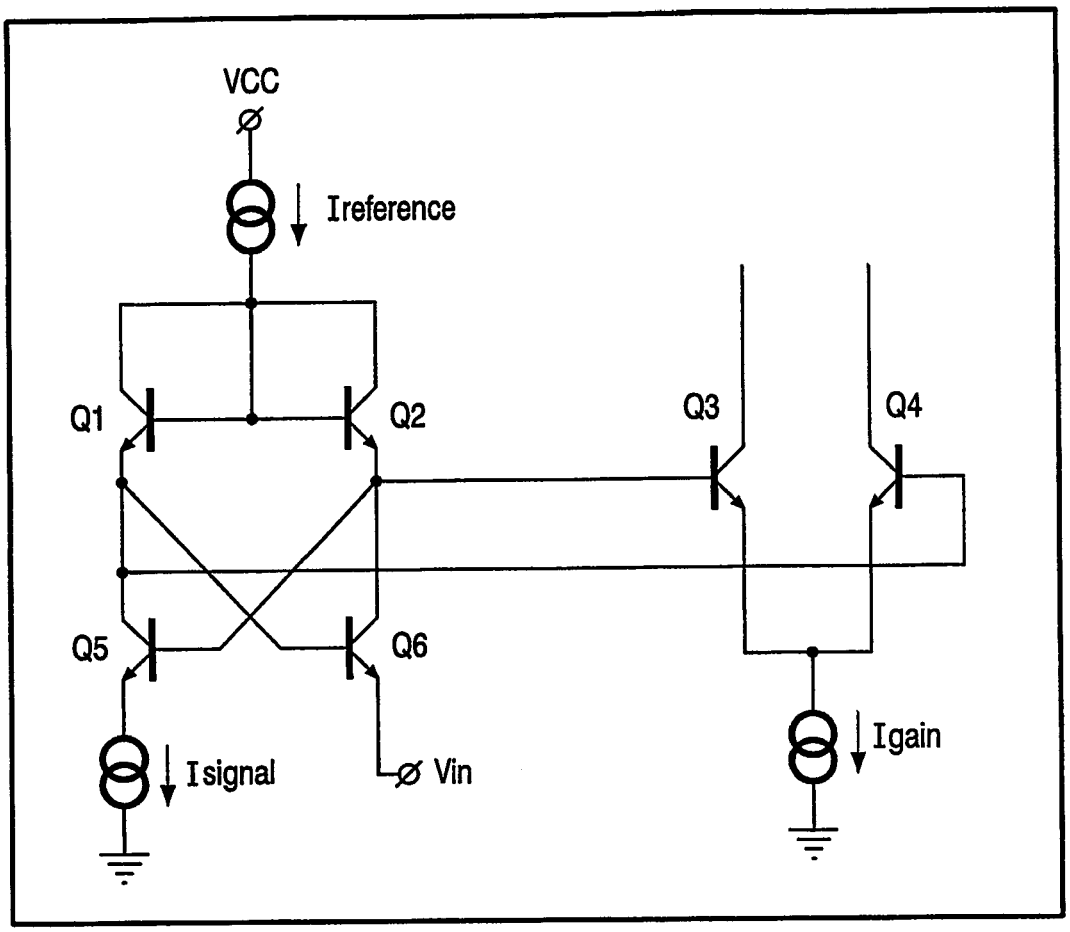
FIG. 5 shows a detailed embodiment of the electronic circuit of FIG. 2, FIG. 6 to 9 show a variety of detailed embodiments for the voltage conversion in the embodiments of FIGS. 1 and 2.

FIG. 5 shows an embodiment which corresponds to the embodiment of FIG. 2. In comparison to the embodiment FIG. 4 the currents Isignal and Igain are interchanged. As a result the current Igain is split rather than the current Isignal.

The voltage Vin determines the input voltage at the emitter of Q5. The resulting current in the collector branches of the transistors Q3 and Q4 is the same as in the embodiment of FIG. 4.

Figure 6:
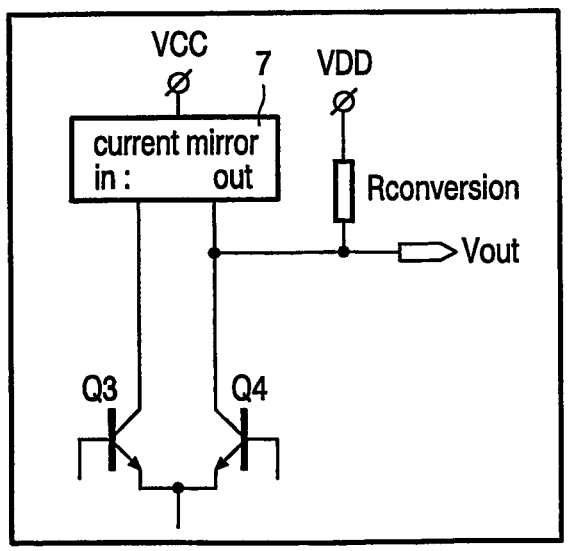

FIG. 6 shows one way of converting the compensated current signal to voltage by means of the integrated resistor Rconversion. The collector branches of the transistors Q3 and Q4 (cf. FIG. 4 and FIG. 5) are connected to current mirror 7. The resistor Rconversion is connected between the collector potential of the transistor Q4 and VDD to produce the voltage Vout.

Figure 7:
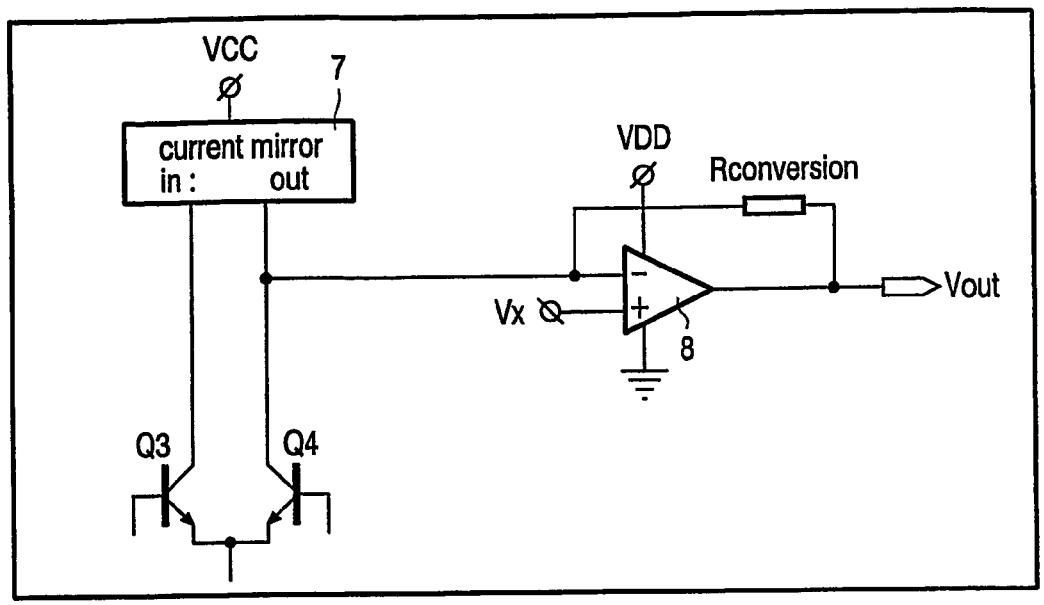

FIG. 7 shows an embodiment of block 5 of FIGS. 1 and 2 with feedback. To provide feedback an operational amplifier 8 is used for producing the voltage Vout. A voltage reference Vx is connected to the non-inverting input of the operational amplifier 8. The inverting input of the operational amplifier 8 is coupled to the collector potential of the transistor Q4. The resistor Rconversion is coupled between the inverting input of the operational amplifier 8 and the output of the operational amplifier 8.

Figure 8:
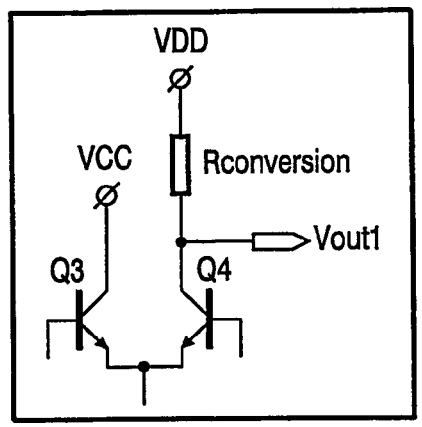

FIG. 8 shows an alternative embodiment where only one of the collector currents is used for the conversion. For this purpose the resistor Rconversion is coupled between VDD and the collector potential of the transistor Q4 in order to produce the output voltage Vout. This corresponds to a choice of $N=\frac{1}{2}$.

Figure 9:
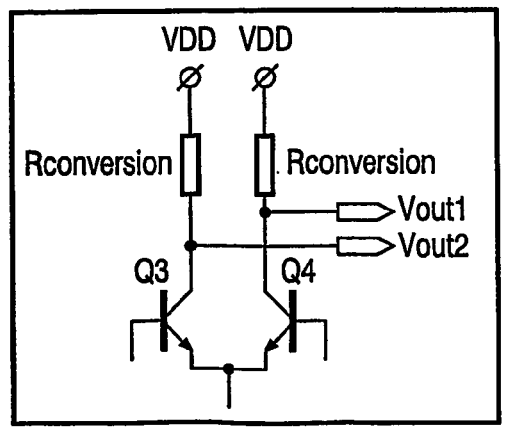

FIG. 9 shows a further embodiment for producing a differential output voltage Vout1 and Vout2. A resistor Rconversion is coupled between VDD and collector potential for both transistors Q3 and Q4. The differential voltage Vout=Vout1−Vout2 can be used for input to an amplifier in a computer monitor or for similar applications requiring a differential output voltage.

In essence it is possible to implement the present invention by means of an extra line per input current signal and a separate line to provide the reference current Ireference. For an audio-mono signal this means that two lines are required—one for the current signal Isignal and one for the reference current Ireference. For an audio-stereo signal an additional line for the additional audio channel is required. For the case of RGB-video three signal lines for the three channels are required in addition to the line for the reference current Ireference.

Rather than inputting the signal current(s) and the reference current on separate lines a differential input can be provided. In the case of an audio-mono signal this can be implemented by providing a signal Ireference−Isignal on one line and Ireference+Isignal on the other line. Likewise this can be implemented for more than one channel.

Alternatively the number of input lines can be restricted to the number of channels. In other words a separate line for Ireference can be avoided. This can be accomplished by utilizing the current signal itself as a basis to form the reference current Ireference. This can be done by using a maximum, a minimum, an average value or the RMS of Isignal as a reference. For example, in the case of a video signal the black signal of each video frame or line can be utilized as the reference Ireference.

In case of more than one channel one or more or all of the channels can be used to form the reference current Ireference.

As a further alternative the input line for the signal Isignal is time multiplexed to provide the reference current Ireference. In case of more than one channel one or more or all of the channels can be utilized for time multiplexing the reference current.

| List of reference numerals | |
|---|---|
| electronic circuit | 1 |
| block | 2 |
| divider | 3 |
| multiplier | 4 |
| block | 5 |
| current mirror | 6 |
| current mirror | 7 |
| operational amplifier | 8 |

The invention claimed is:

1. An electronic circuit for converting a current signal (Isignal) to a voltage signal (Vout) comprising:
   a first resistor (Rgain) and a second resistor (Rconversion),
   means (2) for generating a first current (Igain) based on a reference voltage (Vreference) applied over the first resistor,
   means (3, 4) for generating a second current, the magnitude of the second current being determined on the basis of the multiplied magnitude of the first current and the current signal,
   means (5) for applying the second current to the second resistor for generating the voltage signal.

2. The electronic circuit of claim 1 the means for generating comprising:
   means (3) for dividing the first current by a reference current (Ireference) to determine a first parameter (Igain/Ireference),
   means (4) for multiplying the current signal and the first parameter to generate the second current.

3. The electronic circuit of claim 1 the means for generating comprising:
   means (3) for dividing the current signal by a reference current to determine a first parameter (Isignal/Ireference),
   means (4) for multiplying the first current and the first parameter to generate the second current.

4. The electronic circuit of claim 1, the means for generating the first current comprising current mirror means (6).

5. The electronic circuit in accordance with claim 1 the means for generating the second current comprising:
   a differential pair of bipolar transistors (Q3, Q4),
   means (Q1, Q2, Q5, Q6) for applying a differential base-emitter voltage to the differential pair of bipolar transistors, the differential voltage being a logarithmic function of the first current divided by a reference current.

6. The electronic circuit of claim 5, only one of the collector currents of the differential pair of bipolar transistors being coupled to the second resistor.

7. The electronic circuit of claim 5, both collector currents of the differential pair of bipolar transistors being coupled to the respective ones of second resistors to produce a differential voltage signal.

8. The electronic circuit of claim 1 comprising means for providing the reference current based on a maximum current signal or a minimum current signal or an average current signal or the RMS of the current signal.

9. The electronic circuit of claim 8 the means for providing the reference current being adapted to provide the reference current based on the black signal component of a current video signal.

10. The electronic circuit of claim 1 further comprising means for time multiplexing of an input line for the current signal in order to provide a time multiplexed reference current.

11. The electronic circuit of claim 1, the electronic circuit being an integrated circuit and the first and second resistors being integrated in the integrated circuit.

12. A method for converting a current signal to a voltage signal comprising the steps of:
   generating a first current by means of applying a reference voltage to a first resistor,
   generating a second current, the magnitude of the second current being determined on the basis of the multiplied magnitudes of the first current and the current signal,
   applying the second current to the second resistor for generating the voltage signal.

13. The method of claim 12 the step of generating a second current comprising the steps of:
   dividing the first current by a reference current to determine a first parameter,
   multiplying the current signal and the first parameter to generate the second current.

14. The method of claim 12 the step for generating the second current further comprising:
   dividing the current signal by a reference current to determine a first parameter,
   multiplying the first current and the second parameter to generate the second current.

15. The method of claim 12 further comprising providing the reference current based on a maximum of the current signal, a minimum of the current signal, an average of the current signal or a RMS value of the current signal.

16. The method of claim 12 further comprising providing the reference current by time multiplexing an input line for the current signal.

* * * * *